United States Patent [19]

Nagy et al.

[11] Patent Number: 4,791,073
[45] Date of Patent: Dec. 13, 1988

[54] TRENCH ISOLATION METHOD FOR SEMICONDUCTOR DEVICES

[75] Inventors: Andrew G. Nagy; Robert J. Mattox, both of Tempe, Ariz.

[73] Assignee: Motorola Inc., Schaumburg, Ill.

[21] Appl. No.: 122,094

[22] Filed: Nov. 17, 1987

[51] Int. Cl.⁴ .................. H01L 21/471; H01L 21/475
[52] U.S. Cl. ...................................... 437/67; 156/646; 156/657
[58] Field of Search .................. 437/67; 156/643, 644, 156/657, 646

[56] References Cited

U.S. PATENT DOCUMENTS 4,484,979  11/1984  Stocker .............................. 156/643
4,626,317  12/1986  Bonn ................................... 156/643
4,631,219  12/1986  Geipel, Jr. et al. ................. 428/131

FOREIGN PATENT DOCUMENTS 0076942  4/1983  European Pat. Off. ............. 437/67
0182538  10/1984  Japan .................................... 437/67
0193044  11/1984  Japan .................................... 437/67
0124841  7/1985  Japan .................................... 437/67

Primary Examiner—O. Chaudhuri
Attorney, Agent, or Firm—Robert M. Handy

[57] ABSTRACT

A method is described for forming dielectric filled isolation trenches in semiconductor substrates in which a differentially etchable etch-stop layer is provided above the surface of the substrate during the trench filling process so that the height of the trench filling relative to the surface of the substrate may be adjusted for optimum overall results during subsequent fabrication steps and so that the substrate surface may be protected from contact with the etching reagents used during planarization of the trench filling material. This avoids damage to the substrate surface and permits improved surface planarity.

18 Claims, 2 Drawing Sheets

TRENCH ISOLATION METHOD FOR SEMICONDUCTOR DEVICES

BACKGROUND OF THE INVENTION

This invention relates, in general, to semiconductor devices and, more particularly, to a means and method for providing an insulating isolaion wall for electrically isolating one portion of an integrated semiconductor device structure or circuit from another. The isolation wall is formed in a trench provided in the semiconductor substrate.

The copending application by Robert Mattox et al., U.S. Ser. No. 122,086, entitled "Trench Isolation Process and Structure", and the copending application of Bridgette A. Bergami, et al, U.S. Ser. No. 122,091, entitled "Multilayer Trench Isolation Process and Structure", are related.

It is commonplace to provide isolation walls between adjacent devices or device regions in integrated circuits, particularly bipolar integrated circuits. In the prior art these isolation walls have been formed of a dielectric such as silicon dioxide or a combination of silicon dioxide and polycrystalline silicon. A disavantage of using thermally grown silicon dioxide for the isolation walls is that oxide growth progresses laterally as well as vertically making achievement of small lateral dimensions and precise dimensional control more difficult. In addition, trapped voids are frequently formed when oxide is used, particularly in trenches whose depth is equal to or larger than their width. Trapped voids are undesirable.

Further, silicon dioxide, which is the most commonly used trench refill material, whether grown or deposited, has a different coefficient of thermal expansion than most semiconductor substrates. As a consequence, when the semiconductor wafer is heated and cooled during processing, the differential thermal expansion and contraction of the isolation wall of the substrate can induce great stress in the semiconductor substrate. This leads to defect formation in the substrate adjacent the isolation wall, which is undesirable.

It is known in the prior art to replace part of the dielectric of the isolation wall with a polycrystalline semiconductor of the same material as the substrate. The poly region is isolated from the substrate by a thin oxide region on the sides of the isolation wall trench or is doped so as to form a PN junction with the single crystal semiconductor substrate material, or both. While the use of such a polycrystalline plug in the isolation wall can reduce the differential expansion mismatch, it creates other problems well known in the art.

In a related application by Robert Mattox et al., noted above, a means and method for overcoming a number of the limitations of the prior art are described in which an oxy-nitride is used as the principal material for filling the isolation trenches. In this process trenches are etched in the semiconductor substrate and filled with a low stress oxy-nitride. The oxy-nitride is then planarized with, for example a photoresist, and etched back to the semiconductor surface. However, this process and structure suffer from the limitation that there is no etch-stop provided to protect the substrate surface during planarization etching of the trench material or permit easy adjustment of the height of the trench filling material relative to the substrate surface. Accordingly, the oxy-nitride in the trenches may be over etched and severely recessed and the substrate surface may be damaged.

Accordingly, it is an object of the present invention to provide an improved means and method for isolation walls for semiconductor devices and integrated circuits.

It is an additional object of the present invention to provide an improved means and method for isolation walls for semiconductor devices and integrated circuits formed by etch-out and refill, wherein an etch-stop layer is provided to allow improved control of the etch-back and planarization process.

It is a further object of the present invention to provide an improved means and method for isolation walls for semiconductor devices and integrated circuits wherein the coefficient of thermal expansion of the wall material is advantageously controlled relative to the semiconductor substrate, and in which any latent voids or etch sensitive regions of the as-deposited wall material are removed and replaced by an etch resistant dielectric.

It is an additional object of the present invention to provide an etch-stop to facilitate planarization of the wall material while minimizing substrate surface damage.

SUMMARY OF THE INVENTION

The foregoing and other objects and advantages are provided by the means and method of the present invention wherein a semiconductor substrate having a principal surface is provided, a first (optional) layer that is differentially etchable with respect to the substrate is formed on the substrate surface, a second layer that is differentially etchable with respect to the first layer is formed on the first layer, and a masking material is provided over the second layer having an opening therein extending to the second layer. Using the opening in the mask, the underlying portions of the second layer, the first layer, and part of the substrate are etched away to form a trench extending into the substrate. A third layer of material differentially etchable with respect to the second layer is deposited in the trench and conformally over the second layer. The thickness of this third layer should be sufficient so that the trench is filled. The portion of the third layer extending over the second layer is removed leaving the part of the third layer in the trench remaining in place.

It is convenient at this point to lightly etch the structure so as to remove any etch sensitive material which may exist at the center of the trench where opposing faces of the growing third layer joined together as the trench was filled. Any gap in the trench material created by this etching step is filled by depositing a fourth layer of a material that is differentially etchable with respect to the second layer in the gap, over the trench and over the exposed second layer. The portion of the fourth layer above the second layer is removed leaving part of the fourth layer in the gap in the trench. The height of the trench and gap filling material is reduced by etching until approximately level with first layer or substrate surface. The second layer is removed. The portion of the first layer remaining on the substrate surface may also be removed. However, use of the first layer is optional.

Silicon dioxide formed, for example, by thermal oxidation of the substrate is an example of a material suitable for use as the first layer. Polycrystalline silicon formed by chemical vapor deposition or other standard techniques well known in the art is an example of a material suitable for the second layer material. Silicon oxy-nitride is an example of a material suitable for the third layer. Silicon nitride is an example of a suitable fourth layer material. Means and methods for forming silicon dioxide, silicon oxy-nitride, silicon nitride, and polycrystalline silicon are well known in the art or described herein. LPCVD is an example of a suitable technique.

A more complete understanding of the present invention along with further advantages thereof can be attained from the following description in conjunction with the accompanying drawings.

DETAILED DESCRIPTION OF THE FIGURES

FIGS. 1-8 are simplified schematic cross-sectional views of the isolation wall portion of a semiconductor device during various stages of fabrication according to the present invention. For convenience and by way of example, FIGS. 1-8 are described in terms of an exemplary semiconductor material (e.g. silicon) and exemplary dielectric layers (e.g. silicon oxide, silicon oxy-nitride, polycrystalline silicon, and silicon nitride) but those of skill in the art will understand that this is merely for purposes of explanation and that other semiconductor materials and other dielectrics well known in the art and having the described properties could also be used.

Semiconductor substrate 10 of, for example, silicon, having surface 11, has thereon optional dielectric layer 12 of, for example, thermally grown silicon dioxide. It is desirable that layer 12 be differentially etchable with respect to substrate 10. Silicon dioxide is an example of a differentially etchable dielectric material. Other differentially etchable dielectric materials are also known and may be used.

Surface 13 of layer 12 is covered by layer 14 of, for example, polycrystalline silicon. It is important that layer 14 be differentially etchable with respect to layer 12. Polycrystalline silicon is an example of a material that is differentially etchable with respect to silicon dioxide, however, other differentially etchable materials known in the art could also be used. Examples are, to name but a few, polycrystalline germanium, silicides, intermetallics, and other dielectrics. Polycrystalline silicon is conveniently deposited by low pressure chemical vapor deposition (LPCVD), a technique well known in the art.

Figure 1:
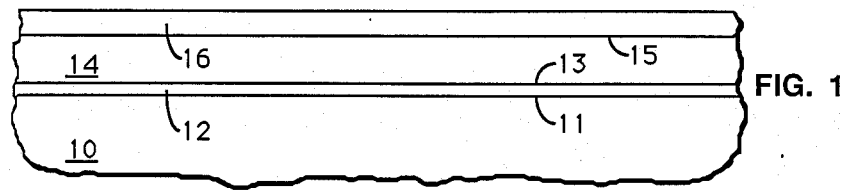
FIGS. 1-8 show simplified cross-sections through a portion of a semiconductor substrate containing an isolation wall according to the present invention and at different stages of manufacture.

Mask layer 16 is deposited on surface 15 of layer 14. The resulting structure is shown in FIG. 1. Mask layer 16 may be, for example, of any suitable etch resistant material. Examples are photoresist and refractory dielectrics such as oxides or nitrides of silicon and other materials. Such oxides and nitrides are conveniently formed by LPCVD techniques well known in the art.

Figure 2:
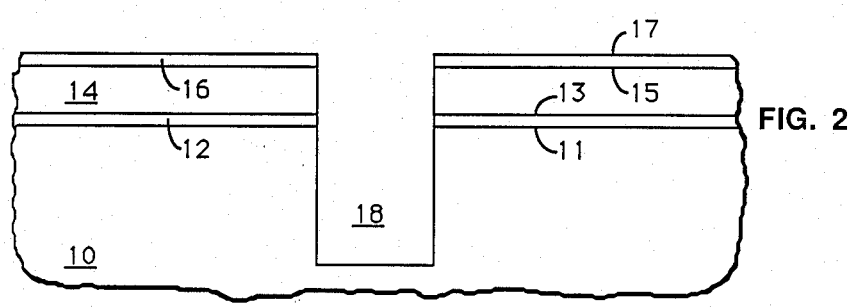

Using techniques well known in the art, an opening is provided in mask layer 16 and through this opening the underlying portions of layers 14, 12 and substrate 10 are etched so as to provide trench 18 in substrate 10. The result is shown in FIG. 2. Where mask 16 is of photoresist or other low temperature organic material it should be removed at this point.

Figure 3:
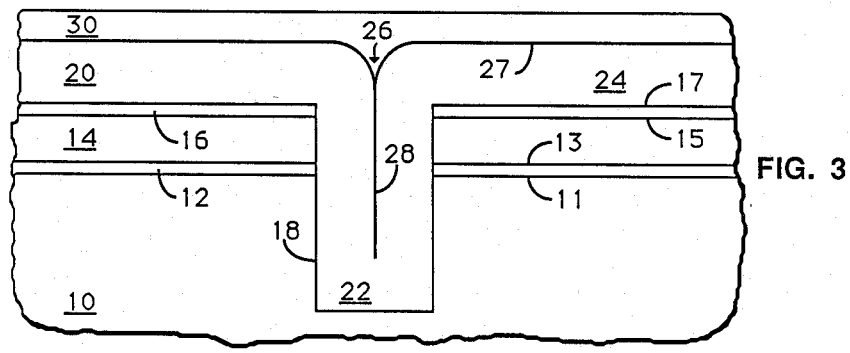

The structure is then covered by oxy-nitride layer 20 which is conformally deposited on surface 17 of layer 16 and within trench 18 so that portion 22 of oxy-nitride layer 20 fills trench 18 and portion 24 of oxy-nitride layer 20 deposits on surface 17 of layer 16. The result is shown in FIG. 3. Part of layer 16 shown as remaining in FIG. 3 but this is optional. Oxy-nitride layer 20 is conveniently formed by the methods desired in the copending application by Robert Mattox et al., noted above.

Frequently, notch 26 will be observed above the central portion of dielectric 22 in trench 18. If such a dielectric filled trench is sectioned and stained or very lightly etched it is sometimes found that seam 28 is revealed where the opposing faces of the inward growing portions of oxy-nitride layer 20 within trench 18 joined together. This is illustrated in FIG. 3.

Planarizing layer 30 is applied to surface 27 of layer 20 and then, using means described later, the combination of planarizing layer 30 and oxy-nitride layer 20 is etched so that notch 26 is removed without removing dielectric 22 within trench 18. Any remaining portions of mask layer 16 on surface 15 of layer 14 are removed in this process. The result is shown in FIG. 4.

An advantage of the oxy-nitride material of layer 20 is that it is differentially etchable with respect to the polycrystalline silicon of layer 14. Thus, layer 14 provides an etch-stop during the planarization etch-back step in which surface 29 of oxy-nitride material 22 in trench 18 is exposed and surface 15 of layer 14 is exposed. This result is shown in FIG. 4.

Figure 4:
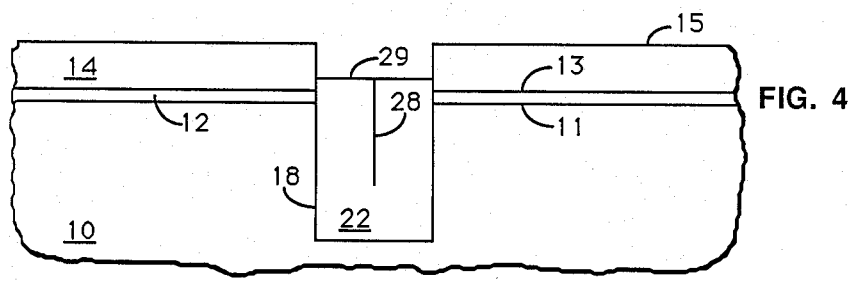
Figure 5:
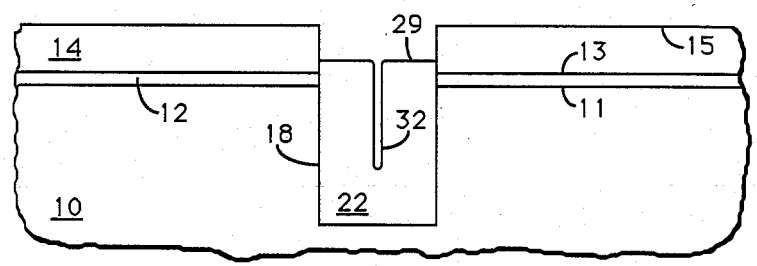

While seam 28 in and of itself does no harm in the structure, if the structure of FIG. 4 is exposed to etching steps during subsequent processing, the portion of oxy-nitride 22 adjacent seam 28 may be more etch sensitive than the rest of material 22. As a consequence it is desirable at this point in the process to deliberately subject the structure of FIG. 4 to an etching step to remove any etch sensitive material associated with seam 28. Where seam 28 is etch sensitive this procedure produces gap or crevice 32 as shown in FIG. 5. This etching step is a desirable precautionary measure.

Figure 6:
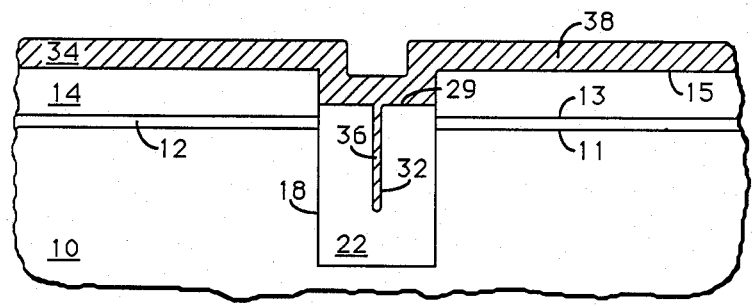

Crevice or gap 32 is then desirably filled by depositing material 34 over surface 15 of layer 14 and in gap or crevice 32. Layer 34 has portion 38 over surfaces 15 and 29, and portion 36 filling crevice 32. It is desirable that the material of layer 34 be differentially etchable with respect to the material of layer 14 and also be generally resistant to subsequent etching steps involved in the processing of substrate 10 during later device forming steps (not shown). Silicon nitride has been found to be a suitable material for layer 34. The result is shown in FIG. 6. Other refractory nitrides may also be used.

Figure 7:
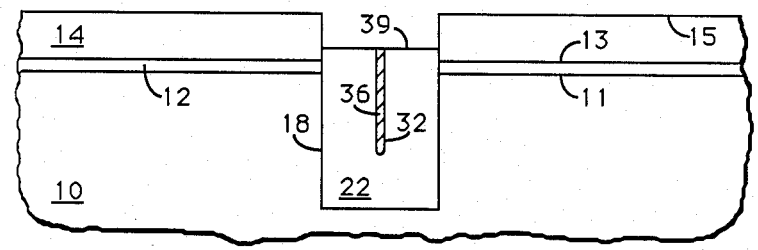

Layer 34 and the upper part of gap or crevice plug 36 and oxy-nitride trench material 22 is then etched so as to expose surface 39 of oxy-nitride 22 and nitride 36 above trench 18, as shown in FIG. 7. Polycrystalline silicon layer 14 protects the remainder of substrate 10 during this etching step. Methods for differentially etching silicon nitride and silicon oxy-nitride as compared to silicon are described later. It is desirable that surface 39 be located at or close to the plane of surface 11 of substrate 10. The result is shown in FIG. 7.

Figure 8:
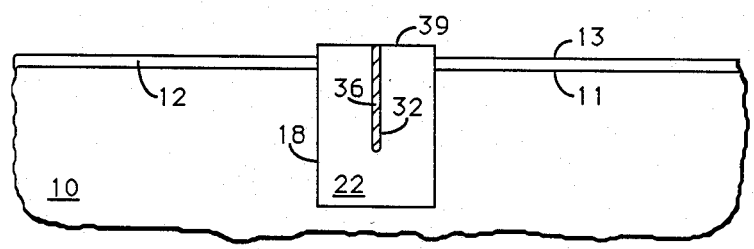

Polycrystalline silicon layer 14 is then removed from surface 13 of layer 12 as shown in FIG. 8. Where layer 14 is of polycrystalline silicon and substrate 10 is also silicon, layer 12 performs the function of providing a differential etch-stop so that layer 14 may be removed above substrate 10. However, where layer 14 is not of the same material as substrate 10 but is of another, differentially etchable material with respect to substrate 10, layer 12 need not be used.

The structure shown in FIG. 8 comprising substrate 10 containing trench 18 filled with oxy-nitride dielectric 22 and nitride 36 in crevice 32 is now suitable for further conventional device processing for the formation of particular device regions. Means and methods for forming device regions are well known in the art and are not within the scope of this invention. Layer 12 may be left in place or may be removed and replaced by other materials. As those of skill in the art will appreciate, the differential elevation between surface 39 of the filled trench and surface 11 of the substrate may be adjusted by varying the amount of etching illustrated in FIG. 7. It is desirable to have the overall structure as flat and smooth as possible across the entire wafer being processed.

EXAMPLE

Conventional silicon wafer substrates 10 were thermally oxidized to provide surface silicon dioxide layer 12 of thickness in the range 0.02 to 0.05 micrometers, with about 0.03 micrometers being typical. Polycrystalline silicon layer 14 of approximately 0.3 to 0.5 micrometers thickness with about 0.4 micrometers thickness being typical was deposited using conventional low pressure chemical vapor deposition techniques on surface 13 of layer 12. Polysilicon layer 14 was undoped but this is not essential. Thicker and thinner polycrystalline silicon layers and differentially etchable materials other than polycrystalline silicon could also be used.

Mask layer 16 was formed by deposition of low temperature silicon dioxide using conventional techniques. Other techniques for forming a silicon dioxide or other hard mask layer could also be used. A thickness of 0.2 to 0.5 micrometers is convenient with about 0.4 micrometers being typical.

Photoresist was applied and masked so as to provide an opening extending to layer 16. Layer 16 was etched through this opening to expose upper surface 15 of poly layer 14. The etching process was continued, preferably in the same reactor (e.g., Applied Materials Type 8110) through the same opening until the material of layer 14 and layer 12 underlying the opening had been removed exposing upper surface 11 of substrate 10. Substrate 10 was etched through the same opening, using for example an Applied Materials Type 8210 reactor, to form trench 18 as illustrated in FIG. 2. Reactive ion etching is a convenient means for performing the above described etching steps. Those of skill in the art will understand how to vary the gas composition in the reactive ion etcher in order to etch oxide, polycrystalline silicon, and single crystal silicon. Such methods and apparatus therefore are well known in the art.

Oxy-nitride layer 20 was then conformally deposited over surface 17 and into trench 18 using the methods described in copending related application by Robert Mattox, noted earlier which is incorporated herein by reference. The result is shown in FIG. 3 and described in more detail in the above noted copending related application.

Planarizing layer 30 of conventional photoresist was applied by means well known in the art. The combination of photoresist layer 30 and oxy-nitride layer 20 was etched in a Type 8110 reactor manufactured by Applied Materials, Inc., of Santa Clara, Calif. using a gas comprising a mixture of $CHF_3$ and $O_2$ in proportions of about 50-60:25-35 SCCM flow, preferably 56:29, at about 40-60 millitorr pressure, preferably 55 millitorr, and 800-1200 watts of RF power, preferably about 1100 watts, until substantially all of the resist and most of the oxy-nitride above the surface was removed. The etch gas composition was then changed to lower the oxygen content. The $CHF_3:O_2$ ratio was conveniently changed to about 70-90:5-10 SCCM flow, preferably about 80:7, at about the same pressure and power settings. The first gas etch gas composition provides planarization while the second has better etch differentiation between the combination of planarization layer 30 with oxy-nitride layer 20 and underlying polysilicon layer 14, so that polysilicon layer 14 acts as an etch-stop for the process and the oxynitride is planarized. The result of this planarization step is shown in FIG. 4.

The structure of FIG. 4 was then dip etched in buffered HF so as to remove the etch sensitive material associated with seam 28 to produce crevice or gap 32 shown in FIG. 5. Silicon nitride layer 34 was deposited over the structure of FIG. 5 to fill crevice 32. This deposition was carried out in a conventional low pressure chemical vapor deposition reactor using a mixture of dichlorosilane and ammonia. The thickness of layer 34 is conveniently in the range of 0.1 to 0.3 micrometers with about 0.2 micrometers being typical. The nitride layer was then etched in a Type 8110 plasma reactor manufactured by Applied Materials, Inc. of Santa Clara, Calif. using an etch gas comprising a mixture of $CHF_3$ and $CO_2$ in proportion of about 50-70:10-20 (SCCM $CHF_3:CO_2$), preferably about 60:15, at about 15-25 millitorr, preferably at about 20 millitorr and at about 900-1200 watts RF power, preferably about 1100 watts, so as to expose layer 14, as shown in FIG. 7.

Polycrystalline silicon layer 14 was then stripped using reactive ion etching in a Type 8120 plasma reactor manufactured by Applied Materials, Inc., of Santa Clara, Calif. in a gas mixture comprising $Cl_2$ and $H_2$ at conventional pressures and power levels. Other gas mixtures such as for example HCl may also be used. (This same reactor and gas mixture may also be used for etching trench 18 in single crystal silicon substrate 10.) Methods for plasma etching of polysilicon (and single crystal silicon) are well known in the art. The result is shown in FIG. 8. The structure of FIG. 8 is then ready for further processing for the construction of individual device regions. Such further processing is well known in the art.

Having thus described the invention, it will be apparent to those of skill in the art that various modifications can be made within the spirit and scope of the present invention. For example, layer 12 is required if layer 14 and substrate 10 are not differentially etchable, for example where both are of the same material, otherwise it may be omitted. Assuming that layer 14 and layer 10 are of the same material, it is important that layer 14 be differentially etchable with respect to layer 12 and that layer 12 be differentially etchable with respect to substrate 10.

Layers 20 and 34 are desirably of oxy-nitride and nitride or analogous materials. The nitride is differentially etchable with respect to both polylayer 14 and oxide layer 12. Thus, there are two etch stops so far as the nitride is concerned. The polylayer or equivalent is needed when etching the oxy-nitride layer, particularly an oxide rich oxy-nitride, since the etch selectivity of oxy-nitride is high with respect to polysilicon but negligible with respect to pure oxide. When etching the nitride, either the polysilicon or oxide can serve as an etch stop.

Layer 16 functions as a hard mask and while use of a low temperature oxide is suitable, other etch resistant masking materials may also be used. Further, while the steps illustrated in FIGS. 1–3 show that a portion of layer 16 remains in place after etching trench 18, this is not essential. Layer 16 is provided only to facilitate the etching of trench 18 and may be removed anytime thereafter. In particular layer 16 may be removed prior to deposition of oxy-nitride 20. Use of a hard mask material, such as for example silicon dioxide, for layer 16 is desirable because of the superior resistance of hard mask materials such as oxides or nitrides to reagents and gases which etch the semiconductor substrate during the trench etching step.

While the preferred method for forming oxy-nitride 20 is that described in copending related application by Robert Mattox et al. noted above, other methods for forming oxy-nitride layer 20 may also be used. Oxy-nitride layers may be produced, for example, by the procedures described in U.S. Pat. No. 3,883,889. In addition, other materials that are differentially etchable with respect to layer 14 may also be used. However, oxy-nitride is the preferred material.

The trench walls in substrate 10 may be covered with a thin dielectric before the trench is filled with oxy-nitride mixture 20. Silicon dioxide, such as might be produced by thermal oxidation or other oxide formation technique is an example of such further dielectric. This layer should be thin as compared to the oxy-nitride filling so that the average coefficient of expansion of the trench filling material is still dominated by the oxy-nitride filling. An advantage of oxy-nitride as a trench filling material is that the coefficient of thermal expansion of oxy-nitride relative to silicon may be adjusted by varying the oxy-nitride composition. Typical thickness of thermally grown oxide used on the trench sidewalls is in the range 0.005–0.02 micrometers with about 0.01 micrometers being convenient.

Layer 34 performs the function of filling crevice or gap 32 etched out around seam 28. While silicon nitride is the preferred material, other materials which bond well to dielectric 22 and which are resistant to subsequent process steps, particular etching steps, may also be used. It is important that the material of layer 34 be differentially etchable with respect to layer 14.

As those of skill in the art will appreciate, the provision of etch-stop layer 14 in conjunction with the other combinations of materials and layers used in the present structure and method, permit the height of surface 39 above filled trench 18 to be adjusted with respect to the plane of surface 11 of substrate 10 so as to lie as close to the plane of surface 11 (or surface 13) as is desired. This is particularly advantageous for the construction of devices.

Because of variations in the process across a wafer, surface 39 of some trench filling on one part of the wafer may lie slightly above the plane of substrate surface 11 (or oxide surface 13) and some on another part of the wafer slightly below. The techniques described herein make it possible to adjust surface 39 to the optimum desired location. For example, the average location of surface 39 may be adjusted to be at the surface so that the variations are approximately evenly split above and below the surface. This minimizes the typical step height across the isolation wall. This is advantageous.

The presence of etch stop layer 14 permits the height of trench filling surface 39 relative to substrate surface 11 or dielectric layer surface 13 to be adjusted without exposing surface 13 or 11 to the reagents used for etching the trench filling material. This is an advantage since it reduces damage to these surfaces which otherwise may occur during planarization etch back of the trench filling material. Avoiding such damage while being able to adjust the height of surface 39 relative to surfaces 13 or 11 is particularly desirable.

In the preferred embodiment, etch-stop layer 14 is left in place during the deposition and etching of layer 38. However, in a further embodiment of the invention, etch-stop layer 14 is removed anytime after the step illustrated in FIG. 4, that is anytime after planarization of oxy-nitride layer 20 and prior to deposition of nitride layer 34. Under these circumstances it is desirable during planarization to continue etching of surface 29 of oxy-nitride plug 22 so that it more closely approaches surface 13 or 11 prior to removal of layer 14, for example to the location of surface 39 in FIG. 7. After layer 14 is removed, layer 34 of for example silicon nitride is deposited as before and etched to leave plug portion 36 in gap 32 as shown in FIG. 8. Since layer 14 is no longer present, oxide layer 12 conveniently acts as an etch stop during etching of nitride layer 34. Surface 11 of substrate 10 is still protected during etching. However, layer 12 is not essential. For example, where substrate 10 is silicon and plug 22 is silicon oxy-nitride and gap plug 36 is nitride, oxy-nitride 22 and gap plug 36 are differentially etchable with respect to substrate 10. Thus, plugs 22, 36 can still be etched after removing etch-stop layer 14 even if layer 12 is omitted. However, this is less desirable under circumstances where such etching would damage surface 11.

As those of skill in the art will appreciate based on the description herein, the height of surface 39 above surface 11 or 13 can be adjusted for any of the embodiments by varying the amount of etching provided, for example, during planarization of the oxy-nitride and/or planarization of the nitride and/or during further etching steps. The location of surface 39 as being above surfaces 11 and 13 shown in FIG. 8 is merely by way of example. By adjusting the etching times, surface 39 may be etched to substantially the same level as surface 11 or 13, taking into account the process variation across the wafer, discussed earlier.

While the method and structure of the present invention have been described particularly as applied to silicon substrates, those of skill in the art will appreciate that the method and structure may be used with other substrates besides silicon, including composite substrates and substrates of other semiconductor materials. These and other variations such as will occur to those of skill in the art based on the teachings herein are intended to be included in the claims which follow.

We claim:

1. A method for forming an isolation wall in a semiconductor device, comprising:

providing a semiconductor substrate having a principal surface;

forming a dielectric layer on the principal surface;

forming a polycrystalline semiconductor layer on the dielectric layer;

forming a masking layer having an opening on the polycrystalline layer;

removing a portion of the polycrystalline layer and the dielectric layer and the substrate underneath the opening to form a trench extending through the polycrystalline layer and the dielectric layer and into the substrate;

depositing a first material comprising a silicon oxy-nitride overlying the polycrystalline layer and in the trench to substantially fill the trench at least to the polycrystalline layer;

removing the first material above the polycrystalline layer thereby exposing a first upper surface of the first material in the trench;

etching a crevice in the first upper surface of the first material in the trench;

filling the crevice with a second material comprising silicon nitride extending above the polycrystalline layer;

etching the second material to expose the polycrystalline layer, the first upper surface, and a second upper surface of the second material so that the second upper surface is substantially level with the first upper surface; and removing the polycrystalline layer.

2. The method of claim 1 wherein the step of removing the oxy-nitride material comprises etching the first material in a gas comprising $CHF_3$ and oxygen at pressures in the range 40–60 millitorr.

3. The method of claim 1 wherein the step of removing the silicon nitride material comprises etching the silicon nitride material in a gas comprising $CHF_3$ and $CO_2$ at pressures in the range 15–25 millitorr.

4. The method of claim 1 wherein the step of etching the first material comprises isotropically etching the first material.

5. The method of claim 1 wherein the step of etching the first material comprises etching the first material without intervening masking steps.

6. The method of claim 1 wherein the step of forming a dielectic layer comprises thermally oxidizing the substrate surface.

7. The method of claim 1 further comprising prior to the step of depositing the first material, forming a dielectric layer at least on walls of the trench exposed in the substrate.

8. The method of claim 5 wherein the step of forming the dielectric layer comprises forming a silicon oxide layer.

9. The method of claim 1 further comprising prior to the step of removing the first material, depositing a planarizing layer on the first material.

10. The method of claim 9 wherein the step of removing the first material comprises simultaneously removing a portion of the first material and a portion of the planarizing layer.

11. A method for providing a dielectric filled trench extending into a semiconductor substrate, comprising:

providing a semiconductor substrate having a principal surface;

forming a first layer on the substrate surface, wherein the first layer is a dielectric differentially etchable with respect to the substrate;

forming a second layer on the first layer, wherein the second layer comprises polysilicon and is differentially etchable with respect to the first layer;

providing a masking material over the second layer and forming a first opening therein extending to the second layer;

through the first opening, etching underlying portions of the second layer and first layer to expose an underlying portion of the substrate;

etching the underlying portion of the substrate to form a trench therein extending into the substrate;

depositing a third layer in the trench and extending over the second layer, wherein the third layer is differentially etchable with respect to the second layer;

removing the third layer extending over the second layer, leaving part of the third layer in the trench;

forming a second opening extending at least partly into the third layer in the trench;

filling the second opening with a fourth layer extending over the second layer, wherein the fourth layer is differentially etchable with respect to the second layer;

removing the fourth layer above the second layer while leaving the fourth layer in the second opening; and removing the second layer.

12. The method of claim 11 further comprising after the step of removing the fourth layer above the second layer, simultaneously removing part of the third layer above the trench and part of the fourth layer in the second opening.

13. The method of claim 11 wherein the step of forming the second opening comprises etching a central portion of the third layer in the trench.

14. The method of claim 11 wherein the third layer comprises a silicon oxy-nitride and wherein the step of removing the third layer comprises etching the oxy-nitride in a gas comprising $CHF_3$ and oxygen.

15. The method of claim 11 wherein the fourth layer comprises silicon nitride and the step of removing the fourth layer comprises etching the fourth layer in a gas comprising $CHF_3$ and carbon dioxide.

16. The method of claim 11 wherein the third layer comprises a silicon oxy-nitride and wherein the step of removing the third layer comprises etching the oxy-nitride in a gas comprising $CHF_3$ and oxygen and wherein the fourth layer comprises silicon nitride and the step of removing the fourth layer comprises etching the fourth layer in a gas comprising $CHF_3$ and $CO_2$, and wherein the step of etching the silicon oxy-nitride is carried out at a first gas pressure and the step of etching the nitride is carried out at a second gas pressure and wherein the first and second gas pressures are in the ratio (oxy-nitride etch gas pressure:nitride etch gas pressure) of about 40–60:15–25.

17. The method of claim 11 wherein the steps of removing the third layer and removing the fourth layer comprise gaseous etching, respectively, at first and second pressures, and wherein the first pressure is about 2–5 times the second pressure.

18. The method of claim 11 wherein the third layer comprises silicon oxy-nitride and the step of removing the third layer comprises gaseous etching in a mixture comprising $CHF_3$ and $O_2$, and wherein a first portion of third layer is etched using a ratio of $CHF_3:O_2$ in the range 50–60:25–35 and second portion of the third layer is etched using a ratio of about 70–90:5–10.

* * * * *